United States Patent [19]
Schneider et al.

[11] Patent Number: 6,097,233
[45] Date of Patent: Aug. 1, 2000

[54] ADJUSTABLE DELAY CIRCUIT

[75] Inventors: Helmut Schneider, München; Thilo Schaffroth, Röhrmoos; Rüdiger Brede, Höhenkirchen; Gunnar Krause, München, all of Germany

[73] Assignee: Siemens Aktiengesellschaft, Munich, Germany

[21] Appl. No.: 09/228,610

[22] Filed: Jan. 12, 1999

[30] Foreign Application Priority Data

Jan. 12, 1998 [DE] Germany .................. 198 00 776

[51] Int. Cl.⁷ .................................................. H03H 11/26
[52] U.S. Cl. ................................. 327/281; 327/276
[58] Field of Search ......................... 327/261, 263, 327/264, 276, 278, 281, 284, 285, 288

[56] References Cited

U.S. PATENT DOCUMENTS

| | | | |
|---|---|---|---|
| 5,453,709 | 9/1995 | Tanimoto et al. | 327/276 |
| 5,506,534 | 4/1996 | Guo et al. | 327/276 |
| 5,592,116 | 1/1997 | Bedouani | 327/276 |
| 5,621,360 | 4/1997 | Huang | 331/157 |
| 5,917,357 | 6/1999 | Kwon | 327/262 |
| 5,936,451 | 8/1999 | Phillips et al. | 327/285 |
| 6,014,050 | 1/2000 | McClure | 327/281 |

FOREIGN PATENT DOCUMENTS

0647025 A1  4/1995  European Pat. Off. .

OTHER PUBLICATIONS

Japanese Patent Abstract No. 08018413 (Takatomo), dated Jan. 19, 1996.
Japanese Patent Abstract No. 4–135311 (Nagashima), dated May 8, 1992.

*Primary Examiner*—My-Trang Nuton
*Attorney, Agent, or Firm*—Herbert L. Lerner; Laurence A. Greenberg; Werner H. Stemer

[57] ABSTRACT

An adjustable delay circuit for digital signals includes a series circuit which is disposed between two supply potentials and has at least a first transistor of a first conduction type and second and third transistors of a second conduction type. Control connections of the first and second transistors are connected to a signal input of the delay circuit. One connection of the first transistor, which is remote from the first supply potential, is connected to a signal output. A fourth transistor of the second conduction type is connected in parallel with the third transistor. A first control input is connected to a control connection of the third transistor and a second control input is connected to a control connection of the fourth transistor. The control inputs are used to adjust the delay time of the delay circuit.

7 Claims, 2 Drawing Sheets

6,097,233

ADJUSTABLE DELAY CIRCUIT

BACKGROUND OF THE INVENTION

Field of the Invention

The invention relates to a delay circuit for digital signals having an adjustable delay time, including a series circuit disposed between two supply potentials. The series circuit includes controlled paths at least of a first transistor of a first conduction type and second and third transistors of a second conduction type. Control connections of the first and second transistors are connected to a signal input of the delay circuit. One connection of the first transistor, which is remote from the first supply potential, is connected to a signal output of the delay circuit. A fourth transistor is connected in parallel with the third transistor and is of the second conduction type. A first control input is connected to a control connection of the third transistor, and a second control input is connected to a control connection of the fourth transistor. The control inputs are used to adjust a delay time of the delay circuit.

Such a circuit is disclosed in European Patent Application 0 647 025 A1. However, a disadvantage of that circuit is that, when all of the parallel-connected transistors used to adjust the delay time are turned off, the output of the delay circuit floats, that is to say it is not at a fixed potential, so that under some circumstances circuit units connected downstream of the delay circuit are supplied with an undefined potential.

SUMMARY OF THE INVENTION

It is accordingly an object of the invention to provide a delay circuit for digital signals having a variable delay time, which overcomes the hereinafore-mentioned disadvantages of the heretofore-known devices of this general type and which has a simple structure.

With the foregoing and other objects in view there is provided, in accordance with the invention, a delay circuit for digital signals having an adjustable delay time, comprising a signal input and a signal output of the delay circuit; a first transistor of a first conduction type having a controlled path and a control connection; second and third transistors of a second conduction type having controlled paths and control connections; the controlled paths at least of the first, the second and the third transistors connected in a series circuit between two supply potentials; the control connections of the first and the second transistors connected to the signal input; the first transistor having a connection remote from a first one of the supply potentials and connected to the signal output; a fourth transistor of the second conduction type connected in parallel with the third transistor and having a control connection; first and second control inputs for adjusting a delay time of the delay circuit, the first control input connected to the control connection of the third transistor, and the second control input connected to the control connection of the fourth transistor; a fifth transistor of the first conduction type having a control connection connected to the first control input; a sixth transistor of the first conduction type having a control connection connected to the second control input; and at least the fifth and sixth transistors connected in a series circuit between the first supply potential and the signal output.

This structure has the advantage of ensuring that the potential at the signal output always assumes the value of the first supply potential whenever both the third and the fourth transistors have been turned off through the control inputs and a signal which is present at the signal input is therefore not passed on to the signal output. Since the fifth and the sixth transistors are of the opposite conduction type to the third and the fourth transistors, they are turned on when the third and the fourth transistors are turned off (the delay circuit is then deactivated), so that the first supply potential is connected to the signal output. On one hand, this has the advantage of ensuring that the signal output is at a specific potential level (essentially that of the first supply potential), when the third and the fourth transistors are turned off, so that circuit units connected downstream of the delay circuit receive this defined potential level when the delay circuit is deactivated. On the other hand, without the series-connected fifth and sixth transistors, the potential at the signal output would float when the delay circuit is deactivated, so that circuit units connected downstream would be supplied with an undefined potential.

A digital signal present at the signal input is delayed by the delay circuit for different times depending on whether the control inputs have turned on neither the third nor the fourth transistor, or one of the two, or both at the same time. If neither the third nor the fourth transistor has been turned on, the delay time of the delay circuit lasts until at least one of the two is turned on.

It is particularly favorable if further transistors are provided which are each connected in parallel with the third transistor and are each connected to a control input. This has the advantage of permitting the delay time to be varied within wide limits.

In accordance with another feature of the invention, the transistors may, for example, be field-effect transistors.

The third transistor may be disposed either between the first and the second transistor or between the second transistor and the second supply potential.

In accordance with a further feature of the invention, the fourth transistor has essentially the same dimensions, that is to say the same width-to-length ratio of its conductive channel, as the third transistor. This results in the switching behavior of the two transistors being equivalent, which makes precise control of the delay circuit possible. This is because the two transistors can then be turned on or off at the same time by simultaneously changing signals at the control inputs.

In accordance with an added feature of the invention, the third transistor is connected in parallel with not just the fourth transistor alone but with a series circuit including the fourth transistor with a high-value resistor. This makes it possible to achieve a greater time difference for the delay, when connecting or disconnecting the series circuit, than if the high-value resistor was not provided. If the third and the fourth transistors have as low a resistance as possible when turned on, the time response is essentially determined by the parallel-connected high-value resistors, provided that the third transistor is turned off. The delay time can thus be varied within wide limits.

The high-value resistor may, for example, be a transistor connected as a resistor.

In accordance with an additional feature of the invention, each of the control inputs is connected to an output of a respective hold circuit having an input which is connected to a respective control signal through a respective first switching element. The hold circuit serves to store the respective last state of the control signal even when the first switching element is opened. This enables the delay circuit to be programmed once during an initialization phase, for example, without the control signals having to be applied permanently.

In accordance with a concomitant feature of the invention, a circuit node in each hold circuit is connected to a fixed potential through a second switching element, and the second switching element has a control input which is connected to an activation signal. Closing the second switching element enables the second hold circuit to be brought to a defined output state, irrespective of the control signal, so that the delay circuit has a predefined delay time.

The first and the second switching elements may be transistors, for example.

Other features which are considered as characteristic for the invention are set forth in the appended claims.

Although the invention is illustrated and described herein as embodied in a delay circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
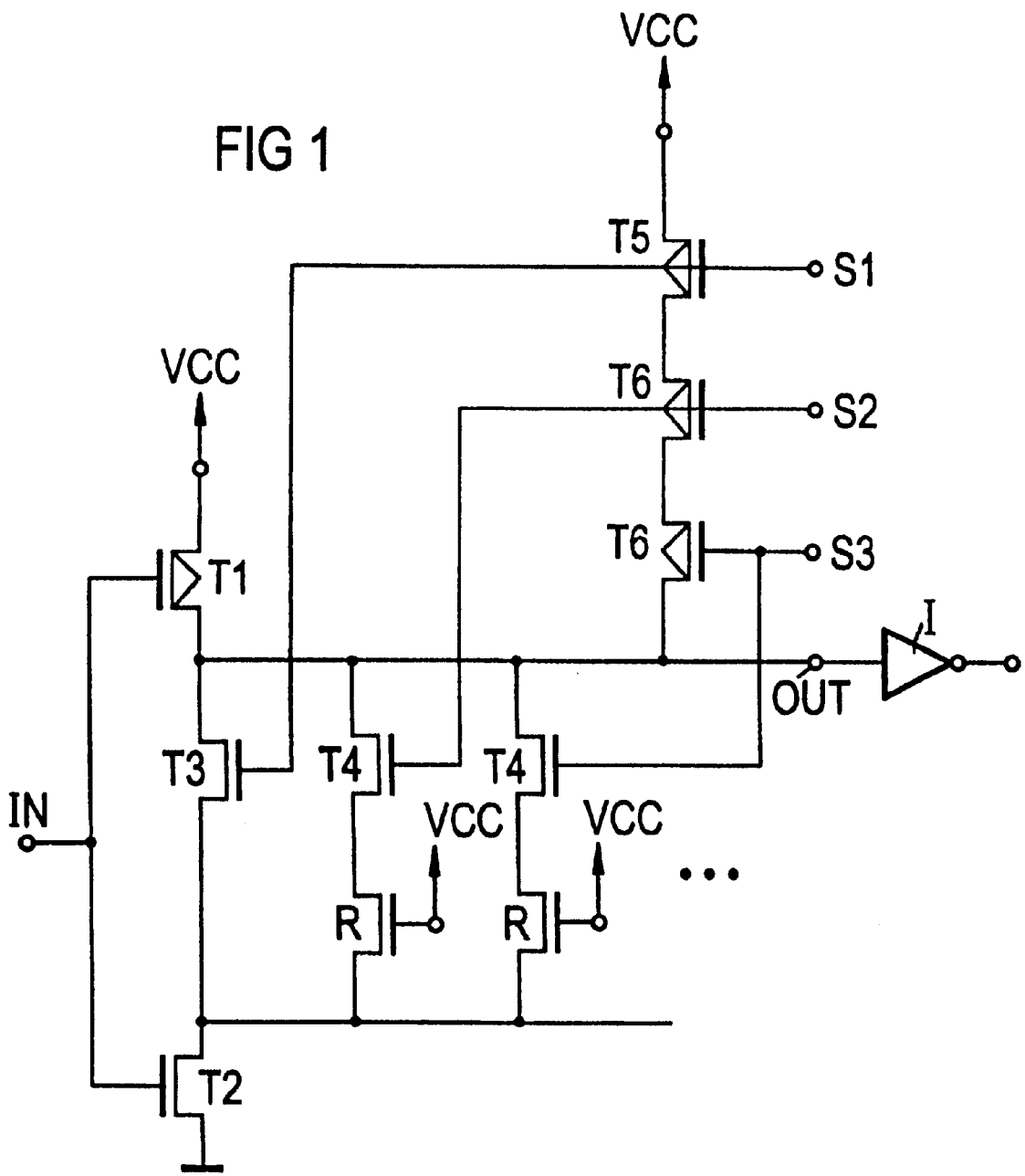
FIG. 1 and FIG. 2 are schematic diagrams of two exemplary embodiments of a delay circuit.

Referring now to the figures of the drawings in detail and first, particularly, to FIG. 1 thereof, there is seen a first exemplary embodiment of a delay circuit. The delay circuit has a CMOS inverter which is supplied by two supply potentials, VCC, ground. The CMOS inverter has an input which forms a signal input IN and an output which forms a signal output OUT of the delay circuit. The CMOS inverter has a first transistor T1 of the p-channel type and a second transistor T2 of the n-channel type. A drain of the first transistor T1 is connected to a drain of the second transistor T2 through a third transistor T3 of the n-channel type. A series circuit which is connected in parallel with the third transistor T3 has a fourth transistor T4 of the n-channel type and a high-value resistor R. The resistor R is an n-channel transistor having a gate connected to the first supply potential VCC. The delay circuit illustrated in FIG. 1 has a large number of such parallel-connected series circuits which all have a fourth transistor T4 and a high-value resistor R, but only two of them are illustrated in FIG. 1. The fourth transistors T4 and the resistors R have identical dimensions in each case. Furthermore, the fourth transistors T4 and the third transistor T3 have identical dimensions, that is to say they also have a matching width-to-length ratio. This means that, with simultaneous driving through their gates, the switching behavior of the third transistor T3 and of the fourth transistors T4 matches. If, for example, there are four parallel circuits with fourth transistors T4 and resistors R, 32 different delay times can be set through the use of the control signals, of which there are then five altogether.

A series circuit which is disposed between the first supply potential VCC and the signal output OUT has a fifth transistor T5 and as many sixth transistors T6 as there are fourth transistors T4. However, only two of the sixth transistors are illustrated. The fifth transistor T5 and the sixth transistors T6 are of the p-channel type. A gate of the third transistor T3 and a gate of the fifth transistor T5 are connected to a first control input S1. Each of the fourth transistors T4 and a respective one of the sixth transistors T6 are connected, by their gates, to a respective other control input S2, S3. An inverter I is connected downstream of the signal output OUT.

The delay circuit illustrated in FIG. 1 operates as follows: the control inputs S1 to S3 are used to adjust the delay time of the delay circuit. If all of the control inputs are at ground potential, the third transistor T3 and the fourth transistors T4 are turned off, and signal changes at the signal input IN have no effect on the signal output OUT. At the same time, the fifth transistor T5 and the sixth transistors T6 are turned on, so that a defined potential, which essentially corresponds to the first supply potential VCC, is established at the signal output OUT. This setting of the delay circuit corresponds to an infinite delay time. A signal which is present at the signal input IN is passed on to the signal output OUT in inverted form only when a high-level potential (corresponding to the first supply potential VCC) is present at least at one of the control inputs S1 to S3.

The third transistor T3 and the fourth transistors T4 have very low resistance when turned on. Therefore, when there is a high level at the first control input S1 and there are low levels at the remaining control inputs S2, S3 (all of the parallel circuits with the third transistor T3 are then turned off), the delay circuit works like a normal CMOS inverter having only the first transistor T1 and the second transistor T2. The more fourth transistors T4 that are connected in parallel with the third transistor T3 by their corresponding control inputs S2, S3, the lower the resultant total resistance becomes between the signal output OUT and the drain of the second transistor T2. Therefore, a different time response is produced for the delay circuit each time.

If at least one of the control inputs S1 to S3 is at a high level, the whole series circuit including the fifth transistor T5 and the sixth transistors T6 is turned off, so that the signal at the signal output OUT is then no longer influenced by this series circuit.

Figure 2:
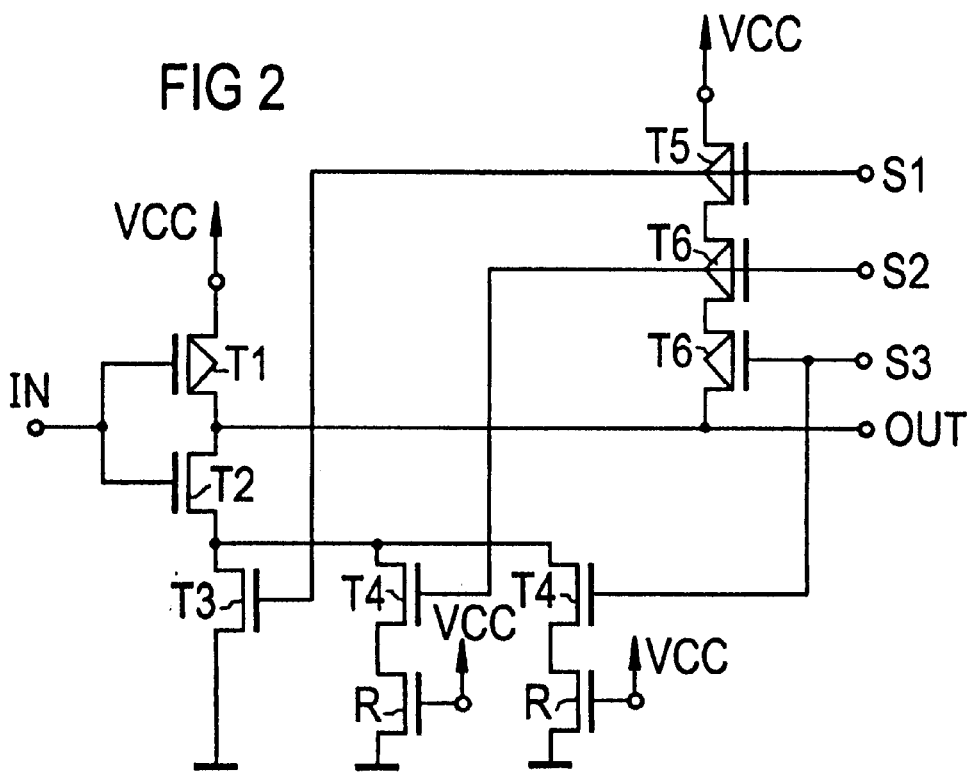

FIG. 2 shows a second exemplary embodiment, which differs from the exemplary embodiment in FIG. 1 only with respect to the configuration of the third transistor T3 and the fourth transistors T4. Instead of being disposed between the first transistor T1 and the second transistor T2, as in FIG. 1, they are disposed between a source of the second transistor T2 and ground in FIG. 2. The way in which this exemplary embodiment operates is exactly the same as for the exemplary embodiment of FIG. 1.

Figure 3:
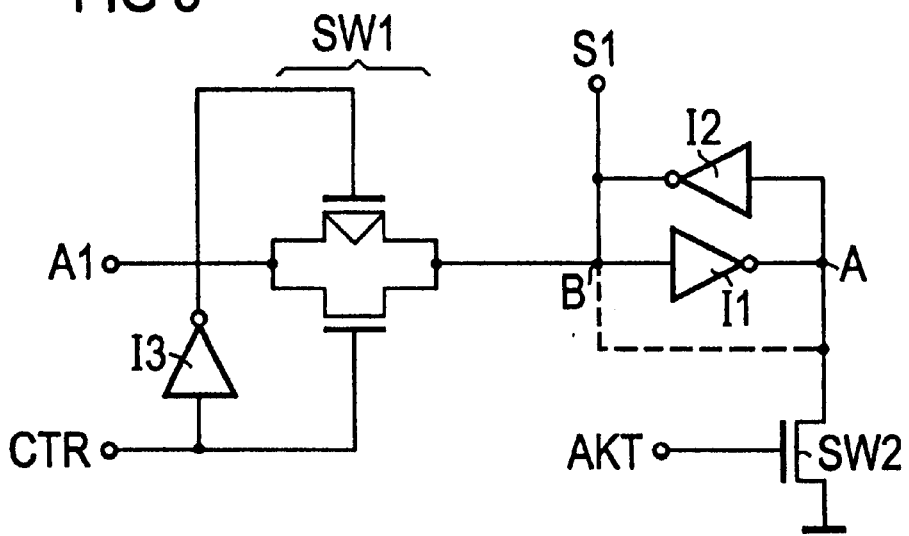
FIG. 3 is a schematic diagram of an expansion of one of the two delay circuits illustrated in FIGS. 1 and 2.

FIG. 3 shows a complementary circuit for one of the delay circuits illustrated in FIGS. 1 and 2. A complementary circuit as shown in FIG. 3 is provided for each of the control inputs S1 to S3 in FIGS. 1 and 2. FIG. 3 relates to a complementary circuit for the first control input S1. The complementary circuit has a hold circuit including two inverters I1, I2 connected anti-parallel or back-to-back. An output of the first inverter I1 and an input of the second inverter I2 are connected to a first circuit node A. An output of the second inverter I2 and an input of the first inverter I1 are connected to a second circuit node B. The second circuit node B is connected to the first control input S1. The second circuit node B is also connected through a transfer gate SW1 to a control signal A1. The transfer gate SW1 can be controlled by a control signal CTR. The control signal CTR is also fed to an inverter I3 leading to the transfer gate SW1. The first circuit node A is connected to ground through an n-channel transistor SW2 having a gate which can be controlled by an activation signal AKT.

The complementary circuit of FIG. 3 operates as follows: the n-channel transistor SW2 and the transfer gate SW1 are dimensioned in such a way that, when the activation signal AKT is at a high level, the state of the hold circuit is determined exclusively by the n-channel transistor SW2. This is also done in such a way that, even when the transfer gate SW1 is turned on, the state of the control signal A1 has no effect on the hold circuit. If the n-channel transistor SW2 is turned on, the first circuit node A is at ground and a high level is then established at the second circuit node B.

If a drain of the n-channel transistor SW2 is connected to the second circuit node B instead of to the first circuit node A, as is indicated by dashed lines in FIG. 3, the level ratios produced for the two circuit nodes A, B when the n-channel transistor SW2 is turned on are exactly reversed.

When the delay circuit is switched on, the activation signal AKT is at a high level at first, so that a predetermined level is established at the first control input S1. This predetermined level depends solely on the circuitry of the hold circuit having the n-channel transistor SW2. Each of the control inputs S1 to S3 in FIGS. 1 and 2 is provided with a corresponding complementary circuit as shown in FIG. 3, and in each of them either the first circuit node A or the second circuit node B is connected to a corresponding n-channel transistor SW2. Therefore, the default setting which may be provided for the delay circuit can be any desired delay time that it can achieve. This default setting is that assumed by the delay circuit when the activation signal is at the high level. The default setting may be defined, for example, during production of the delay circuit through the use of a bonding option.

If, after the high level, the activation signal AKT assumes a low level, the hold circuit first stays at the predefined default state, so long as the transfer gate SW1 is turned off. When the activation signal AKT is at a low level and the transfer gate SW1 is turned on, the state of the control signal A1 has a direct effect on the potential at the first control input S1. Since each control input S1 to S3 is allocated a corresponding control signal A1, it is thus possible to program the delay time of the delay circuits in FIG. 1 and FIG. 2 as desired when the activation signal AKT is at a low level. However, as soon as the activation signal AKT assumes a high level again, the potential at the first circuit node A is pulled to ground by the n-channel transistor SW2, so that the delay circuit is reset to the default setting.

Therefore, whereas the activation signal AKT is used to set the delay circuit to the default state with a predetermined delay time, the control signal CTR is used for programming the delay time as desired as a function of the control signals A1. Both the activation signal AKT and the control signal CTR are supplied to each of the complementary circuits allocated to the control inputs S1 to S3. The control signal CTR may, for example, be a test signal which is used to set an integrated circuit (of which the delay circuit according to the invention is a component) to a test mode in which the control signals A1 can then be used to set the time response of the delay circuit as desired.

We claim:

1. A delay circuit for digital signals having an adjustable delay time, comprising:

a signal input and a signal output;

a first transistor of a first conduction type having a controlled path and a control connection;

second and third transistors of a second conduction type having controlled paths and control connections;

said controlled paths at least of said first, said second and said third transistors connected in a series circuit between two supply potentials;

said control connections of said first and said second transistors connected to said signal input;

said first transistor having a connection remote from one of the supply potentials and connected to said signal output;

a fourth transistor of the second conduction type connected in parallel with said third transistor and having a control connection;

first and second control inputs for adjusting a delay time, said first control input connected to said control connection of said third transistor, and said second control input connected to said control connection of said fourth transistor;

a fifth transistor of the first conduction type having a control connection connected to said first control input;

a sixth transistor of the first conduction type having a control connection connected to said second control input; and at least said fifth and sixth transistors connected in a series circuit between the one supply potential and said signal output.

2. The delay circuit according to claim 1, wherein said third transistor is disposed between said first transistor and said second transistor.

3. The delay circuit according to claim 1, wherein said third transistor is disposed between said second transistor and the other supply potential.

4. The delay circuit according to claim 1, wherein said fourth transistor has substantially the same dimensions as said third transistor.

5. The delay circuit according to claim 1, including a high-value resistor connected to said fourth transistor in a series circuit parallel to said third transistor.

6. The delay circuit according to claim 1, including hold circuits each having an output connected to a respective one of said control inputs, said hold circuits each having an input and a switching element connected between said input and a control signal.

7. The delay circuit according to claim 6, wherein said hold circuits each have a circuit node and another switching element connected between said circuit node and a fixed potential, and said other switching element has a control input connected to an activation signal.

* * * * *